Sept. 27, 1966 W. MEER 3,275,482

SEMICONDUCTOR P-N JUNCTION DEVICE AND METHOD OF ITS MANUFACTURE

Filed Sept. 23, 1964

3,275,482
SEMICONDUCTOR P-N JUNCTION DEVICE AND METHOD OF ITS MANUFACTURE

Winfried Meer, Munich, Germany, assignor to Siemens & Halske Aktiengesellschaft, Berlin and Munich, Germany, a corporation of Germany Filed Sept. 23, 1964, Ser. No. 398,636
Claims priority, application Germany, Sept. 25, 1963, S 87,500
18 Claims. (Cl. 148—177)

My invention relates to a semiconductor device having a p-n junction produced by alloying a metal pellet into a doped, preferably diffusion-doped, region of a semiconductor body, and to the method of producing such a semiconductor device.

It is an object of the invention to improve the high-frequency properties of semiconductor p-n junction devices, particularly those of mesa transistors.

Another, more specific object of the invention is to improve the high-frequency properties of transistors by reducing the base-emitter resistance, for example by reducing the distance between the base contact and the emitter contact and by increasing the area dimensions of the base contact.

According to my invention, the surface of a doped, preferably diffusion-doped, region of a semiconductor body is provided with a layer of increased conductance, extending close to the recrystallization zone. This recrystallization zone is produced by alloying of the semi-conductor body with the above-mentioned metal pellet. The high-conductance layer is further provided with a metallic contact coating. A marginal recess or isolating zone, furthermore, is formed between the alloying pellet and the metallic contact coating by the melting or fusing of the pellet and by consumption of the coating metal in the immediate vicinity of the pellet. The p-n junction formed between the recrystallization zone and the non-alloyed portion of the semiconductor body, as a result of this melting, emerges at the surface within the recess. The marginal recess or isolating zone possesses a groove shape and fully surrounds the alloying pellet completely separating it from the contact-metal coating.

In such a semiconductor device, the semiconductor body proper is provided with an ohmic contact. The ohmic contact has a very large area and extends virtually over the entire portion of the semiconductor surface not covered by the alloy pellet up to the p-n junction produced by alloying the pellet into the semiconductor crystalline body.

Figure 1:
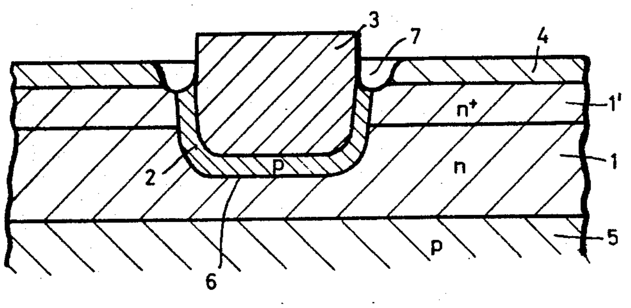
Figure 2:
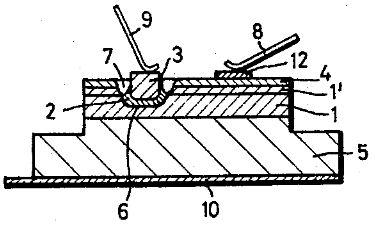

The invention will be further described with reference to the embodiment of a semiconductor device produced in accordance with the invention and illustrated by way of example on the accompanying drawing in which:

FIG. 1 shows schematically a cross section through the portion of the device essential to the invention; and FIG. 2 is a cross section through the entire device on smaller scale, both illustrations being greatly enlarged in comparison with the actual dimensions.

As shown in FIG. 1, an n-type region 1 is produced in an otherwise p-type semi-conductor crystal 5. This n-type region is preferably produced by diffusing donor substance into the crystal. At its upper surface, the n-type region possesses an excessively doped and consequently $n^+$-layer 1', which permits the region 1 to be joined with a barrier-free contact constituted by a top coating 4 of metal. An alloying pellet 3 is alloyed into the n-type region 1 through the more highly doped layer 1'. An alloy-doped recrystallization p-type conductance zone is thus formed between the pellet 3 and the n-type region 1, resulting in a p-n junction at 6. The contacting layer 4 extends on all sides close to the p-n junction. As the pellet 3 is being alloyed into the seimconductor body, a groove 7 is formed in which the p-n junction 6 emerges at the surface. The groove 7 completely interrupts the contact-metal coating 4 and penetrates into the high-conductance layer 1'. It may also penetrate entirely through the layer 1' so as to extend downwardly into the n-type region 1.

It will be understood that the above-mentioned types of conductance are stated by way of example, and that the crystal 5 may also have n-type conductance in which case the region 1 and the layer 1' have respectively p-type and $p^+$-type conductance and the recrystallization zone 2 has n-type conductance.

The complete device shown in FIG. 2 in accordance with FIG. 1 represents the invention applied for example to a mesa transistory. The emitter electrode is constituted by the pellet 3 which, assuming for example that the semiconductor crystal 5 consists of germanium, in this case may consist of aluminum. The pellet electrode 3 is alloyed into the diffused base region 1. The alloying process results in the formation of a groove 7 in which the p-n junction 6 emerges at the surface. The contact-metal coating 4 forms the base electrode of the transistor.

The emitter lead 9 and the base lead 8 are attached by the known thermocompression process. The collector region 5 is contacted with a metal plate 10 and forms a barrier-free bond therewith.

Such a device, in comparison with the known mesa transistors having a small-area base electrode, possesses a considerably reduced base-emitted resistance, thus securing improved high-frequency properties. Since the base electrode 4 surrounds the entire emitter electrode 3, the device also prevents unilaterial loading of the emitter during operation of the transistor.

When producing a semiconductor device according to the invention, the semiconductor surface region having one type of conductance is first provided with a thin barrier-free contact coating of metal. A metal pellet is then placed on top of the device so that it touches the contact coating at least along the margin of the pellet. Thereafter the seimconductor and pellet are heated to the alloying temperature. During the alloying process, the above-mentioned alloy-doped recrystallization zone 2 and the p-n junction 6 are formed. At the same time, the contact metal in the immediate vicinity of the pellet 3 is consumed by alloying so that the marginal oscillating groove 7 is formed in which the p-n junction emerges at the surface. That is, while the metal pellet is alloyed into the semiconductor body, the coating of contact metal in the immediate vicinity of the emitter pellet is dissolved, thus producing the narrow marginal zone or groove, in which the semiconductor is no longer covered by the contact coating.

The method according to the invention will be further described with reference to examples relating to the production of a mesa transistor.

A crystalline disc of germanium having a flat circular shape is first provided with a diffused surface region 1. The dopant thus diffused into the surface region produces therein a conductance type different from that of the original crystal to form a collector-base p-n junction. A metal coating is then deposited upon the diffused region 1. This coating contains a metal which produces in the underlying region 1 the same type of conductance. The semiconductor crystal is then heated so that the metal layer is alloyed into the semiconductor body and produces an excessively doped surface zone 1'. In the instant example, the deposited layer of dopant metal consists of antimony and has a thickness of about 20 to 30 A. The alloying of the metal layer is preferably performed under such conditions that the layer is completely alloyed with the semiconductor material. The vapor deposition of antimony was preferably performed at 500° C. and the temperature during the subsequent alloying was about 620° C. The resulting highly doped surface layer 1′ on top of the diffusion-doped region 1 permits barrier-free contacting of the diffused base region.

After the alloying of the metal layer was completed, a coating of contact metal was vapor-deposited. The coating 4 consisted of silver of a thickness of 80 A. The vapor deposition was effected at 400° C. The emitter electrode was then deposited upon the silver coating, preferably by vapor deposition through a mask. The emitter electrode consisted, for example, of 70% by weight of aluminum and 30% by weight of gold. It was vapor-deposited at 400° C. in a thickness of 2000 A. and thereafter alloyed together with the semiconductor body at 500° C. The electrode metal, particularly the aluminium, then penetrates from the pellet electrode 3 through the contact coating 4 and forms an alloy-doped recrystallization zone 2 as well as the emitter p-n junction 6 in the diffused base region 1. Simultaneously, the metal of the contact coating 4 is dissolved in the vicinity of the emitter pellet electrode 3 so that the metal of the contact coating 4 is removed and a groove 7 is formed. Thereafter, a metal spot as shown in FIG. 2 at 12, may be vapor-deposited upon the contact coating 4.

The emitter, or generally the electrode alloyed into the semiconductor body, may also be formed using a sequence of different metals. For example, prior to depositing the emitter, a metal member having the size of the emitter area may be deposited and alloyed with the contact-metal coating 4. The metal member and the alloying conditions are so chosen that the metal coating will run together in the form of droplets. The emitter metal proper was then vapor-deposited upon this area and thereafter alloyed into the semiconductor body. The astringent effect which causes the metal coating to collect in the form of droplets, prevents lateral spreading of the emitter area and thus secures a defined boundary for the emitter area. This modified process can be performed for example by first vapor-depositing the coating 4 of contact metal, then vapor-depositing a gold layer of 500 A. on an area corresponding as to size and position to that of the emitter area, and thereafter alloying the gold deposit into the semiconductor body. The vapor deposition of the gold was preferably effected at 400° C. and the alloying at 500° C. Thereafter the emitter electrode proper was vapor-deposited in the above-described manner and was alloyed into the semiconductor body.

According to another mode of performing the method of the invention, the emitter electrode 3 is vapor-deposited after the metal layer for highly doping the surface layer 1′ is alloyed into the base region 1, but the emitter electrode is not alloyed into the semiconductor body at that time. The process is rather continued by first vapor-depositing the coating 4 of contact metal in the above-described manner, so that this coating also covers the previously deposited emitter electrode. Thereafter, the assembly is heated to the alloying temperature. Since with this mode of the method, the alloying metal need not diffuse through the contact coating 4, this coating can be given a larger thickness. As a result, the base lead 8, if desired, can be subsequently attached directly to the contact-metal coating 4 without the necessity of adding another metal spot 12.

A still further way of performing the method of the invention is as follows: A germanium disc provided with a diffused region for the production of a mesa transistor was directly coated in high vacuum at 550 to 600° C. with a silver-antimony layer of about 75 A. thickness, without previously vapor-depositing and alloying the metal layer or high-conductance layer 1′ of the same conductance type as the diffused region. The vapor-deposited layer consists for example of 99% by weight of silver and 1% of antimony. Thereafter, the emitter electrode 3 is deposited in the above-described manner and alloyed into the semiconductor body. This results in the production of a marginal zone, such as the groove 7, closely and fully surrounding the emitter electrode, in which groove the semiconductor body is no longer covered by the contacting layer 4 and in which the p-n junction emerges at the surface. Simultaneously, the antimony contained in the contacting layer produces high doping of the diffused region in a narrow zone beneath the contacting coating and thus provides for the required barrier-free contact.

Semiconductor devices produced according to the invention are thereafter subjected to the conventional etching treatment usually employed in the manufacture of mesa transistors, and are then mounted in the known manner. The contacted devices are then cleaned by etching for about 30 seconds in hydrogen peroxide. The silver coating and the emitter electrode then act as masking so that essentially only the emitter p-n junction is subjected to the etching process. The contact-metal coating thus has the further advantage that it acts as a mask during the subsequent purifying of the area in which the p-n junction emerges at the surface, thus affording a thorough cleaning of the electrically active areas without appreciably affecting the high frequency properties of the junction.

Instead of vapor-depositing the coating of contact metal, this coating may also be deposited galvanically or by chemical means.

Furthermore, the coating of contact metal may also be composed of a sequence of different metals which in part are alloyed into the semiconductor body. The invention is analogously applicable to semiconductor devices whose crystalline semiconductor bodies consist of silicon or other semiconductor material.

I claim:

1. A semiconductor p-n junction device comprising a crystalline semiconductor body having a region of one conductance type, a layer of said same conductance type adjacent to said region and having higher conductance than said region, a coating of contact metal on top of said layer, a metal pellet extending from the surface through said contact coating and said high-conductance layer, a semiconductor recrystallization zone alloy-doped by metal from said pellet and having the other conductance type, said zone being located between said pellet and said region and forming a p-n junction with said region, said contact coating having a recess surrounding said pellet and insulating said pellet from said contact coating, said p-n junction emerging at the semiconductor surface within said recess.

2. A semiconductor p-n junction device comprising a crystalline semiconductor body having a diffusion-doped region of one conductance type, a layer of said same conductance type adjacent to said region and having higher conductance than said region, a coating of contact metal on top of said layer, a metal pellet extending from the surface through said contact coating and said high-conductance layer, a semiconductor recrystallization zone alloy-doped by metal from said pellet and of opposite conductance type, said zone being located between said pellet and said region and forming a p-n junction with said region, a groove surrounding said pellet at the surface of said contact coating and completely separating said pellet from said coating, said p-n junction emerging at the semiconductor surface within said groove.

3. In the semiconductor device of claim 2, said groove having a depth extending at least partially through said high-conductance layer.

4. In the semiconductor device of claim 2, said recrystallization zone and p-n junction extending through said high-conductance layer, and said groove having a depth extending through said contact coating into said layer.

5. In the semiconductor device of claim 2, said contact coating consisting of silver.

6. A transistor comprising a crystalline semiconductor body having a collector region of one conductance type and a diffusion-doped base region of the other conductance type forming a p-n junction with each other, said body further having a layer of said one conductance type adjacent to said one region and of higher conductance than said one region, a coating of contact metal on top of said layer, a metal pellet extending from the surface through said contact coating and said high-conductance layer, a semiconductor recrystallization zone alloy-doped by metal from said pellet and having the other conductance type, said zone being located between said pellet and said region and forming a p-n junction with said region, a groove surrounding said pellet at the surface of said contact coating and completely separating said pellet from said coating, said p-n junction emerging at the semiconductor surface within said groove, said contact coating forming a transistor base electrode and said pellet forming an emitter electrode.

7. A transistor of the mesa type comprising a germanium body having a fundamental collector region of p-type conductance, an adjacent donor-diffused mesa region of n-type conductance, an antimony-doped layer adjacent to said region and having higher n-type conductance than said region, a coating of contact metal located on top of said layer and forming an emitter electrode, a pellet of aluminum forming a base electrode and extending from the mesa top surface through said contact coating and said high-conductance layer, said germanium body having an aluminum-doped p-type recrystallization zone between said pellet and said region and forming a p-n junction with said region, said device having, in the mesa top surface surrounding said pellet, a grove completely separating said pellet from said coating, said p-n junction emerging at the semiconductor surface within said groove.

8. The method of producing a semiconductor p-n junction device, which comprises depositing a barrier-free metal coating upon the surface of a semiconductor body having one conductance type at said coating, placing a metal pellet containing dopant for producing the other conductance type in said body upon the body, the pellet contacting the coating at least at the pellet margin, heating the body and pellet to alloying temperature and thereby alloying the pellet through said coating with said body to produce an alloy-doped recrystallization zone of the other conductance type between said pellet and said body whereby a p-n junction is formed and a groove around said pellet is formed in said coating in which groove said p-n junction emerges at the surface.

9. The method of producing a semiconductor p-n junction device according to claim 8, wherein said pellet is vapor-deposited upon said semiconductor body.

10. The method of producing a semiconductor p-n junction device according to claim 8, wherein said semiconductor body consists of germanium and said pellet is formed substantially of aluminum.

11. The method of producing a semiconductor p-n junction device according to claim 8, wherein said semiconductor body consists of germanium and said pellet is formed of an aluminum-gold alloy.

12. The method of producing a semiconductor p-n junction device according to claim 8, which comprises depositing upon said semiconductor body, prior to deposition of said metal coating and pellet, an auxiliary layer which contains dopant for producing said one conductance type, and alloying the auxiliary layer into the semiconductor body to produce therein a surface layer having said one conductance type and a higher conductance than the adjacent portion of said body.

13. The method of producing a semiconductor p-n junction device according to claim 12, wherein said auxiliary layer is formed of antimony and is applied by vapor deposition.

14. The method of producing a semiconductor p-n junction device according to claim 12, wherein said auxiliary layer is formed of metal and given a thickness of 20 to 30 A.

15. The method of producing a semiconductor p-n junction device, which comprises depositing a metal upon the surface of a semiconductor body having at said surface a given conductance type, said metal being a dopant for the same conductance type, alloying said metal into said body to produce therein a doped surface layer whose conductance is higher than that of the adjacent body region, depositing a barrier-free coating of contact metal on top of said high-conductance layer, placing upon the body a metal pellet containing dopant for producing the other conductance type in said body, the pellet contacting the coating at least at the pellet margin, heating the body and pellet to alloying temperature and thereby alloying the pellet through said coating with said body to produce an alloy-doped recrystallization zone of the other conductance type between said pellet and said body whereby a p-n junction is formed and a groove around said pellet is formed in said coating in which groove said p-n junction emerges at the surface.

16. The method of producing a semiconductor p-n junction device according to claim 15, which comprises vapor-depositing said contact-metal coating to a thickness of about 80 A.

17. The method of producing a semiconductor p-n junction device according to claim 15, which comprises depositing upon said semiconductor surface, prior to applying said pellet, a metal layer upon the area to be subsequently occupied by said pellet, said latter layer having an area corresponding in size to that of said pellet, and alloying the latter metal layer with said contact-metal coating so that said latter contracts by forming droplets, and thereafter continuing the method by placing said pellet upon said body.

18. The method of producing a semiconductor p-n junction device, which comprises depositing a metal upon the surface of a semiconductor body having at said surface a given conductance type, said metal being a dopant for the same conductance type, alloying said metal into said body to produce therein a doped surface layer whose conductance is higher than that of the adjacent body region, placing upon the body a metal pellet containing dopant for producing the other conductance type in said body, vapor-depositing a coating of contact metal on top of the semiconductor surface and onto said pellet, and then heating the body to alloying temperature and alloying the pellet into the semiconductor body to produce an alloy-doped recrystallization zone of the other conductance type between said pellet and said body whereby a p-n junction is formed and a groove around said pellet is formed in said coating in which groove said p-n junction emerges at the surface.

References Cited by the Examiner

UNITED STATES PATENTS

| | | | |
|---|---|---|---|
| 2,829,992 | 4/1958 | Gudmundsen et al. | 148—33.2 |
| 3,065,391 | 11/1962 | Hall | 148—33.3 |

FOREIGN PATENTS 907,103 10/1962 Great Britain.

DAVID L. RECK, *Primary Examiner.*

R. O. DEAN, *Assistant Examiner.*